United States Patent
Wolf (10) Patent No.: US 7,594,162 B2
(45) Date of Patent: Sep. 22, 2009

(54) VITERBI PRETRACEBACK FOR PARTIAL CASCADE PROCESSING

(75) Inventor: Tod D. Wolf, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 763 days.

(21) Appl. No.: 11/382,822

(22) Filed: May 11, 2006

(65) Prior Publication Data
US 2006/0256897 A1    Nov. 16, 2006

Related U.S. Application Data

(60) Provisional application No. 60/680,567, filed on May 13, 2005.

(51) Int. Cl.
*H03M 13/03* (2006.01)
(52) U.S. Cl. .................. 714/796; 375/262; 375/265; 375/341; 704/242
(58) Field of Classification Search ................ 714/795, 714/796, 791, 792; 375/262, 265, 341
See application file for complete search history.

(56) References Cited

U.S. PATENT DOCUMENTS

| 6,690,750 B1 * | 2/2004 | Hocevar et al. ............. 375/341 |
| 2009/0049367 A1 * | 2/2009 | Wolf ............................ 714/795 |

OTHER PUBLICATIONS

Hocevar et al. 600 MHZ DSP handles more channels, prepped for 3G basestations. May 13, 2002, EETIMES.*

* cited by examiner

*Primary Examiner*—Guy J Lamarre
*Assistant Examiner*—Sam Rizk
(74) *Attorney, Agent, or Firm*—Robert D. Marshall, Jr.; Wade J. Brady, III; Frederick J. Telecky, Jr.

(57) ABSTRACT

This invention modifies Viterbi decoding to improve BER. Within the state metric unit cascade block, this invention forces the unused ACS units decision bits to a 0 for the top rail and a 1 for the bottom rail. This invention modifies the final maximum state index with the selected decision bits from the unused ACS units. This invention uses the modified final maximum state index as the initial conditions for the k−1 traceback shift register. This invention also uses the final maximum state index to mask the generated pretraceback decision bits generated from the last block of ACS units.

6 Claims, 5 Drawing Sheets

VITERBI PRETRACEBACK FOR PARTIAL CASCADE PROCESSING

CLAIM OF PRIORITY

This application claims priority under 35 U.S.C. 119(e)(1) to U.S. Provisional Application No. 60/680,567 filed May 13, 2005.

TECHNICAL FIELD OF THE INVENTION

The technical field of this invention is Viterbi decoding.

BACKGROUND OF THE INVENTION

Convolutional codes provide forward error correction for second and third generation wireless communications. In forward error correction the transmitter transmits redundant data. The receiver recovers from any errors in transmission using the redundant data. Forward error correction contrasts with systems where the receiver checks for errors and signals for retransmission. In forward error correction no such retransmission is needed or requested. Forward error correction is also used in satellites, modems, digital radios and television set-top boxes.

Figure 1:
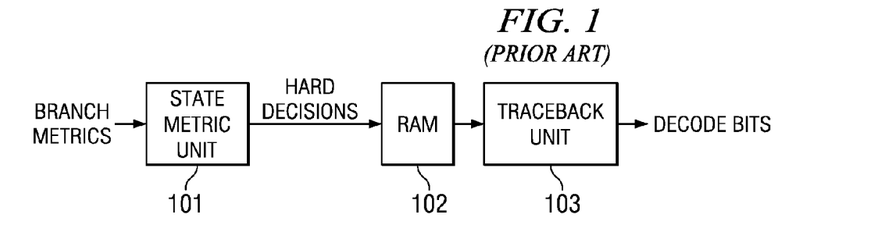
FIG. 1 illustrates the two main functional parts of a prior art Viterbi decoding circuit.

Viterbi decoders are commonly used to decode the coded information in forward error correction systems. FIG. 1 illustrates the two main functional parts of a prior art Viterbi decoding circuit. State metric unit 101 computes state metrics from input branch metrics. The resulting hard decisions are stored in random access memory (RAM) 102. Traceback unit 103 uses the hard decisions stored in RAM 102 to traverse the trellis in reverse order and obtain the decoded bits.

Viterbi decoders have two main parts state metric generation and traceback. If the traceback is not initialized correctly, then the traceback results can fail. This results in poor bit error rate (BER).

Figure 2:
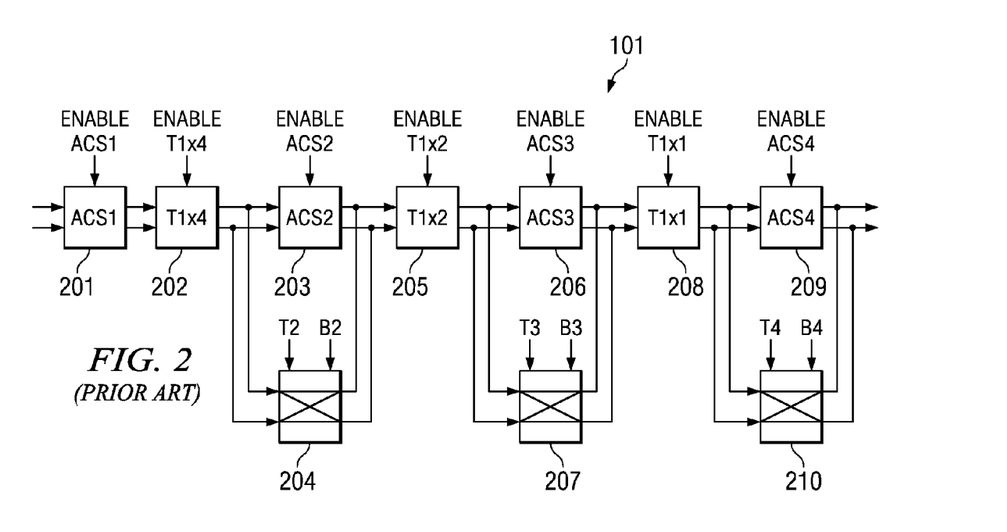
FIG. 2 illustrates the construction of a prior art example state metric unit as illustrated in FIG. 1.

FIG. 2 illustrates the construction of an example state metric unit 101. State metric unit 101 generates $2^{k-1}$ hard decisions, where k is the constraint length. The constraint length k is equal to the number of bits in the encoder that influence the output bits. State metric unit 101 is based on a cascade architecture that provides an area efficient and flexible design. State metric unit 101 consists of three component types: ACS units 201, 203, 206 and 209; transpose units 202, 205 and 208; and pretraceback units 204, 207 and 210. The connections between these units are shown in FIG. 2.

The cascade architecture of FIG. 2 supports trellis sizes from 16 to 256 states or constraint lengths k from 5 to 9. State metric unit 101 performs 4 ACS operations and 3 transpose operations. Each block receives 2 state metrics as inputs and forms 2 state metrics and outputs. Each ACS unit 201, 203, 206 and 209 calculates the state metrics for one trellis stage. Therefore, the 4 ACS units calculate the state metrics for 4 consecutive trellis stages.

The ordering of the specific states within each trellis stage is important. The ordering is such that the calculated data can flow from block to block keeping all units as busy as possible. There are $2^{k-1}$ states for each trellis stage. Using matrix equations it is possible to keep track of the states as they pass through each block. The matrix equations will be in the form of a $2^{k-2}$ by 2 matrix. For example:

$$\begin{bmatrix} a & b \\ c & d \\ e & f \\ g & h \end{bmatrix}$$

This architecture supports radix 16 trellises. For trellis sizes 16 and 256, the architecture can be fully pipelined. For other trellis sizes, the units are not 100% utilized. This requires introduction of holes in the pipeline. The holes are introduced by turning the various blocks off with the enable signals as illustrated in FIG. 2. Table 1 lists activation of each of the units of FIG. 2.

TABLE 1

| Number of state | Pass Number | ACS1 201 | T1x4 202 | ACS2 203 | T1x2 205 | ACS3 206 | T1x1 208 | ACS4 209 |
|---|---|---|---|---|---|---|---|---|
| 256 | 1 | ON | ON | ON | ON | ON | ON | ON |
| 256 | 2 | ON | ON | ON | ON | ON | ON | ON |
| 128 | 1 | ON | ON | ON | ON | ON | ON | ON |
| 128 | 2 | OFF | OFF | ON | ON | ON | ON | ON |
| 64 | 1 | ON | ON | ON | ON | ON | ON | ON |
| 64 | 2 | OFF | OFF | OFF | OFF | ON | ON | ON |
| 32 | 1 | ON | ON | ON | ON | ON | ON | ON |
| 32 | 2 | OFF | OFF | OFF | OFF | OFF | OFF | ON |
| 16 | 1 | ON | ON | ON | ON | ON | ON | ON |

The ON label indicates that the functional block is performing as desired. The OFF label indicates that the functional block is merely passing the data through the block. The pipelining remains constant and is not affected by the blocks activation level.

Figure 3:
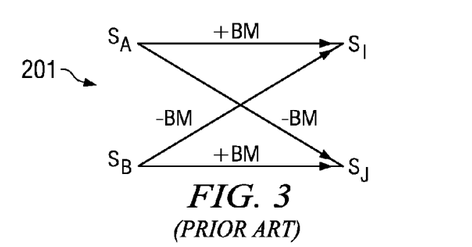
FIG. 3 illustrates a functional diagram of a prior art add, compare and selection units.

The term ACS stands for Add, Compare and Select. FIG. 3 illustrates a functional diagram of ACS units 201, 203, 206 and 209 of FIG. 2. The equations for each ACS unit are:

$$S_I = \max(S_A + BM, S_B - BM); \text{ and}$$

$$S_J = \max(S_A - BM, S_B + BM).$$

This computation is illustrated schematically in FIG. 3. Each ACS unit also generates two decision bits as follows:

$$D_I = 0 \text{ when } (S_A + BM) > (S_B - BM), \text{ else } D_I = 1; \text{ and}$$

$$D_J = 0 \text{ when } (S_A - BM) > (S_B + BM), \text{ else } D_J = 1.$$

Figure 4:
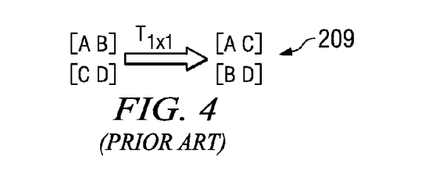
FIG. 4 illustrates the 1 by 1 transpose operation of a prior art first transpose unit illustrated in FIG. 2.
Figure 5:
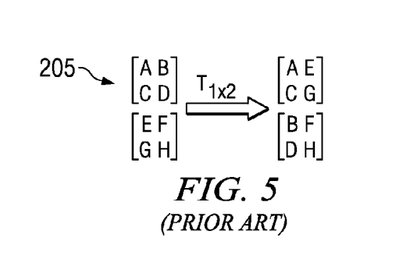
FIG. 5 illustrates the 1 by 2 transpose operation of a prior art second transpose unit illustrated in FIG. 2.
Figure 6:
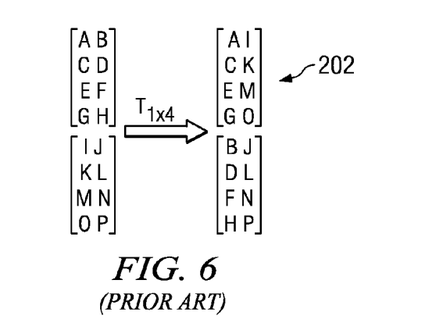
FIG. 6 illustrates the 1 by 4 transpose operation of a prior art third transpose unit illustrated in FIG. 2.

Transpose units 202, 205 and 208 perform matrix transpose operations on the incoming states. FIG. 4 illustrates the 1 by 1 transpose operation of transpose unit 208. FIG. 5 illustrates the 1 by 2 transpose operation of transpose unit 205. FIG. 6 illustrates the 1 by 4 transpose operation of transpose unit 202.

Figure 7:
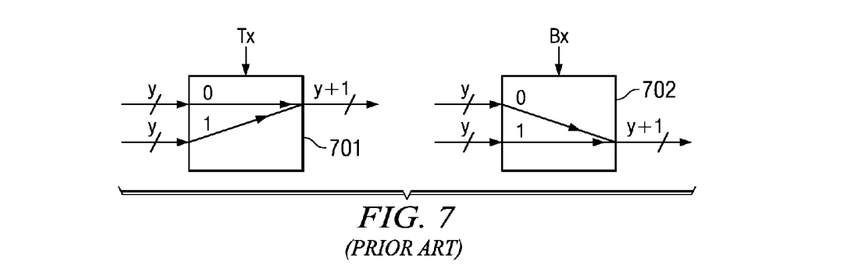
FIG. 7 illustrates prior art cross switches illustrated in FIG. 2.

State metric unit 101 performs the first part of traceback with a register exchange structure as shown in FIG. 2. Cross switches 204, 207 and 210 allow the previously generated decision bits to either stay in their respective rail or cross over to the opposite rail depending on the decision bits from corresponding ACS units. FIG. 7 illustrates cross switches 204, 207 and 210 divided into 2 smaller blocks for additional detail. In the first block 701 input Tx determines which y input is supplied to a first y+1 output. In the second block 702 input Bx determines which y input is supplied to a second y+1 output. The current decision bits are appended to the outputs of each cross switch.

State metric unit 101 cascade structure outputs two 4-bit partial traceback words for each rail. These 8 bits are packed in 32-bit register 801 (see FIG. 8). When register 801 is full, the 32-bit data is stored in hard decision RAM 102.

Figure 8:
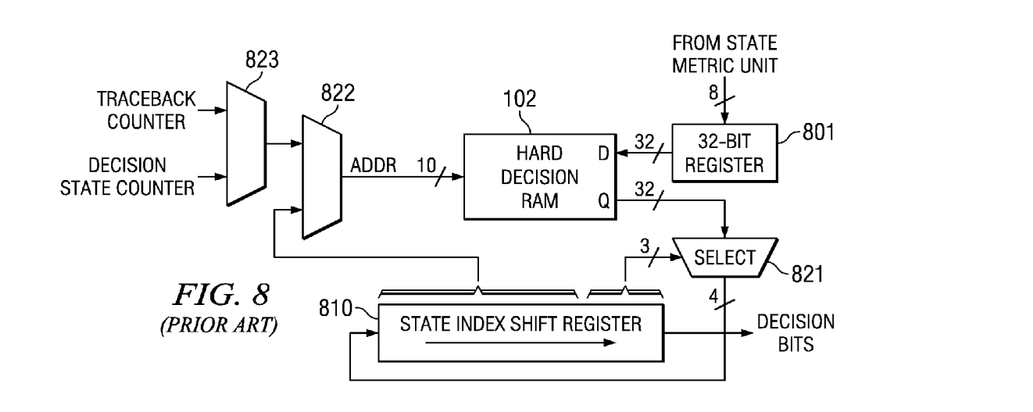
FIG. 8 illustrates a prior art traceback unit performs illustrated in FIG. 2.

The traceback function traverses the trellis in reverse order. Using the previously stored decisions as a guide, traceback unit 103 selects the maximum likelihood path through each trellis section. Each path corresponds to a decoded decision bit. The traceback function is divided into two steps pretraceback and traceback. Pretraceback groups the decoded decision bits into groups of 4 bits. The actual number of bits depends on k and the pass number. Traceback unit 103 performs the second part of the traceback as illustrated in FIG. 8. This part traces backwards through the data. Traceback unit 103 is able to traverse up to four trellis stages at a time due to the pretraceback results. This produces up to four decision bits at a time.

State index shift register 810 contains k−1 elements. Four traceback bits selected by select unit 821 are stored in state index shift register 810 while a set of bits are output. The output bits are used to generate the lower portion of the address for hard decision RAM 102 via concatenater 822. The upper portion of the address comes from multiplexer 823. Multiplexer 823 selects either the decision state counter specifying the address for storing data from register 801 at input D or the traceback counter specifying the address for recalling data at output Q.

Traceback unit 103 works with several constraint lengths from 5 to 9. State metric unit 101 generates a different number of bits depending on the pass number. This is listed in Table 2.

TABLE 2

| k | Valid bits for pass 1 | Valid bits for pass 2 | HD RAM addresses per pass |
|---|---|---|---|
| 9 | 4 | 4 | 32 |
| 8 | 4 | 3 | 16 |
| 7 | 4 | 2 | 8 |
| 6 | 4 | 1 | 4 |
| 5 | 4 | 4 | 2 |

For example, if the constraint length k is 8, then the number of valid bits output from the state metric unit is 4, 3, 4, 3, . . . 4, 3. To simplify the hardware all accesses are treated as four bits. The last column in Table 2 lists the number of hard decision (HD) RAM 103 addresses used per pass.

Figure 9:
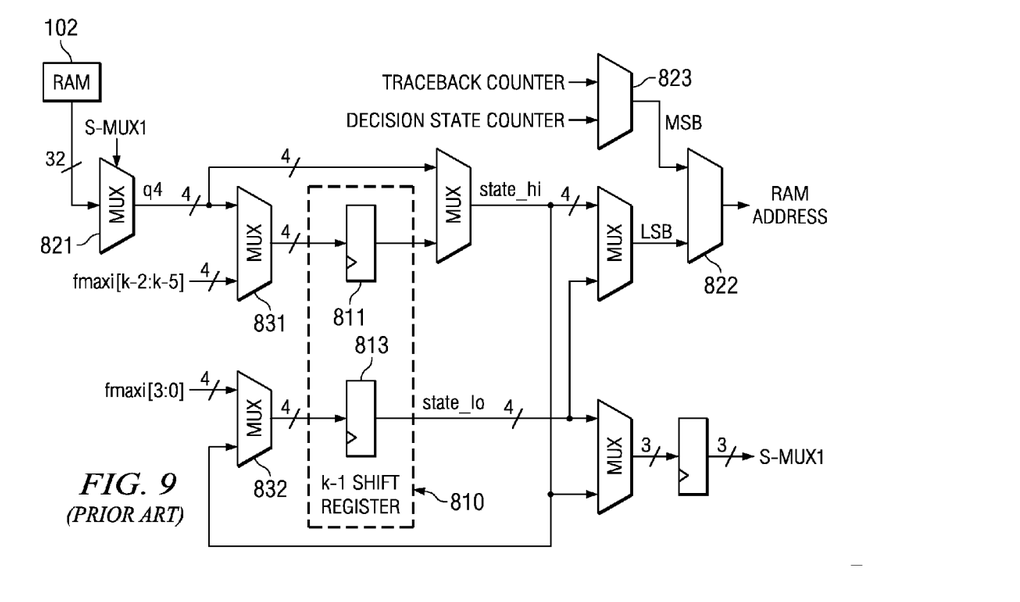
FIG. 9 illustrates an expanded logic diagram of the traceback unit of FIG. 8 with more details of registers and required multiplexers.

FIG. 9 illustrates an expanded logic diagram of traceback unit 103 with more details of registers and required multiplexers. State index shift register 810 is divided into two 4-bit registers 811 and 813. Register 811 stores 4 bits high order bits which are labeled state-hi. Register 813 stores the 4 bit low order bits labeled state_lo.

At the start of the traceback state-hi register 811 is initialized with 4 bits from the fmaxi signal as selected by multiplexer 831. Fmaxi is the starting state index for the traceback. Fmaxi[k−2:k−5] is the last trellis stage with the highest value determined by state metric unit 101. The lower order bits of fmaxi[3:0] initialize state-lo register 813 via multiplexer 832.

During traceback, multiplexer 832 for the LSB addresses for hard decision RAM 102 are listed in column 3 of Table 3. The 32-bit data read from hard decision RAM 102 is grouped into eight 4-bit pretraceback sections. The contents of the state-lo[2:0] register 813 labeled s-mux1 selects one of those eight 4-bit sections via multiplexer 821. These 4-bits labeled q4 are loaded into state-hi register 811 as shown in FIG. 9.

TABLE 3

| k | Pass Number | Hard Decision RAM 102 LSB Address | Hard Decision RAM 102 Data Index |
|---|---|---|---|
| 9 | 1 or 2 | state_hi[3:0] & state_lo[3] | state_lo[2:0] |
| 8 | 1 | state_hi[3:0] | state_lo[2:0] |
| 8 | 2 | state_hi[2:0] & state_lo[3] | state_lo[2:0] |
| 7 | 1 | state_hi[3:1] | state_lo[2:0] |
| 7 | 2 | state_hi[1:0] & state_lo[3] | state_hi[0] & state_lo[2:0] |
| 6 | 1 | state_hi[3:2] | state_lo[2:0] |
| 6 | 2 | state_hi[0] & state_lo[3] | state_hi[1:0] & state_lo[0] |
| 5 | 1 | state_hi[3] | state_lo[2:0] |

The initialization of state-hi register 811 and state-lo register 813 is based on the value of the fmaxi signal. The data stored in the hard decision RAM 102 is grouped into 4-bit groups from the pretraceback units. If either the value of fmaxi or the data stored in hard decision RAM 102 is incorrect, then traceback unit 103 will be incorrectly initialized. This will result in either an incorrect starting address for hard decision RAM 102, incorrect data being read from hard decision RAM 102 or an incorrect multiplexer selection signal s-mux1 of the 32-bit output data from hard decision RAM 102. Any one of these three errors will result in an incorrect data for that group of bits from the pretraceback unit. The incorrect data will result in many failing trellis stages until traceback unit 103 recovers. This leads to a worse BER. This is a serious problem because the main goal of forward error correction (FEC) is to improve the BER.

SUMMARY OF THE INVENTION

Within the state metric unit cascade block, this invention forces the unused ACS units decision bits to a 0 for the top rail and a 1 for the bottom rail. Next, this invention modifies the final maximum state index with the selected decision bits from the unused ACS units. This invention uses the modified final maximum state index as the initial conditions for the k−1 traceback shift register. This invention also uses the final maximum state index to mask the generated pretraceback decision bits generated from the last block of ACS units.

DESCRIPTION OF THE DRAWINGS

These and other aspects of this invention are illustrated in the drawings, in which.

DETAILED DESCRIPTION OF PREFERRED EMBODIMENTS

The Viterbi decoders having the structure illustrated in FIGS. 1 to 9 have poor BER due to incorrect traceback initialization. This invention modifies the logic for the pretraceback logic and traceback initialization logic to correct this problem. The Viterbi decoder of this invention initializes the traceback correctly for all frame lengths and constraint lengths achieving optimum BER.

In this invention traceback unit 103 is initialized correctly as long as the state metric unit ends processing with ACS4 as shown in FIG. 2. State metric unit 101 will process either the frame length plus the convergent length f+c or one less than the frame length and the constraint length f+k−1 ACSs depending on the convergent mode. Thus f+c=x and x%(k−1) must end with ACS4 unit 209 active. ACS4 unit 209 is active when it is ON as listed in tables 4 to 8 for the various constraint lengths. Table 4 lists the functional unit activation at the end of trellis for a constraint length k of 5.

TABLE 4

| Pass Number | x % 4 | ACS1 201 | T1x4 202 | ACS2 203 | T1x2 205 | ACS3 206 | T1x1 208 | ACS4 209 |
|---|---|---|---|---|---|---|---|---|
| 1 | 0 | ON | ON | ON | ON | ON | ON | ON |
| 1 | 3 | ON | ON | ON | ON | ON | ON | OFF |
| 1 | 2 | ON | ON | ON | ON | OFF | ON | OFF |
| 1 | 1 | ON | ON | OFF | ON | OFF | ON | OFF |

Table 5 lists the functional unit activation at the end of trellis for a constraint length k of 6.

TABLE 5

| Pass Number | x % 5 | ACS1 201 | T1x4 202 | ACS2 203 | T1x2 205 | ACS3 206 | T1x1 208 | ACS4 209 |
|---|---|---|---|---|---|---|---|---|
| 1 | 4 | ON | ON | ON | ON | ON | ON | ON |
| 1 | 3 | ON | ON | ON | ON | ON | ON | OFF |
| 1 | 2 | ON | ON | ON | ON | OFF | ON | OFF |
| 1 | 1 | ON | ON | OFF | ON | OFF | ON | OFF |
| 2 | 0 | OFF | OFF | OFF | OFF | OFF | OFF | ON |

Table 6 lists the functional unit activation at the end of trellis for a constraint length k of 7.

TABLE 6

| Pass Number | x % 6 | ACS1 201 | T1x4 202 | ACS2 203 | T1x2 205 | ACS3 206 | T1x1 208 | ACS4 209 |
|---|---|---|---|---|---|---|---|---|
| 1 | 4 | ON | ON | ON | ON | ON | ON | ON |
| 1 | 3 | ON | ON | ON | ON | ON | ON | OFF |
| 1 | 2 | ON | ON | ON | ON | OFF | ON | OFF |
| 1 | 1 | ON | ON | OFF | ON | OFF | ON | OFF |
| 2 | 0 | OFF | OFF | OFF | OFF | ON | ON | ON |
| 2 | 5 | OFF | OFF | OFF | OFF | ON | ON | OFF |

Table 7 lists the functional unit activation at the end of trellis for a constraint length k of 8.

TABLE 7

| Pass Number | x % 7 | ACS1 201 | T1x4 202 | ACS2 203 | T1x2 205 | ACS3 206 | T1x1 208 | ACS4 209 |
|---|---|---|---|---|---|---|---|---|
| 1 | 4 | ON | ON | ON | ON | ON | ON | ON |
| 1 | 3 | ON | ON | ON | ON | ON | ON | OFF |
| 1 | 2 | ON | ON | ON | ON | OFF | ON | OFF |
| 1 | 1 | ON | ON | OFF | ON | OFF | ON | OFF |
| 2 | 0 | OFF | OFF | ON | ON | ON | ON | ON |
| 2 | 6 | OFF | OFF | ON | ON | ON | ON | OFF |
| 2 | 5 | OFF | OFF | ON | ON | OFF | ON | OFF |

Table 8 lists the functional unit activation at the end of trellis for a constraint length k of 9.

TABLE 8

| Pass Number | x % 8 | ACS1 201 | T1x4 202 | ACS2 203 | T1x2 205 | ACS3 206 | T1x1 208 | ACS4 209 |
|---|---|---|---|---|---|---|---|---|
| 1 | 4 | ON | ON | ON | ON | ON | ON | ON |
| 1 | 3 | ON | ON | ON | ON | ON | ON | OFF |
| 1 | 2 | ON | ON | ON | ON | OFF | ON | OFF |
| 1 | 1 | ON | ON | OFF | ON | OFF | ON | OFF |
| 2 | 0 | ON | ON | ON | ON | ON | ON | ON |
| 2 | 7 | ON | ON | ON | ON | ON | ON | OFF |
| 2 | 6 | ON | ON | ON | ON | OFF | ON | OFF |
| 2 | 5 | ON | ON | OFF | ON | OFF | ON | OFF |

If the last active trellis stage was not ACS4 209, that is if the last active trellis stage was ACS1 201, ACS2 203 or ACS3 208, then both the decision bits for the unused ACS units are zeros. They are zeros because there is no input information. Zeros are commonly added because the final state metric index fmaxi can be shifted with zeros to generate the new fmaxi.

Table 9 shows an example of the incorrect traceback initialization. In this example k=8, f=135 and c=21. The traceback mode is convergent, therefore f+c=156. No channel errors were added in this scenario.

TABLE 9

| enc index | enc input bit | enc state | state_hi | state_lo | RAM Address | RAM Output | dec bits |
|---|---|---|---|---|---|---|---|
| 137 | 0 | 118 | 0 | 10 | 0 + 40 (16) = 640 | bbbbbbbb | b |
| 138 | 0 | 108 | | | | | |
| 139 | 0 | 88 | | | | | |
| 140 | 1 | 49 | 10 | 0 | 10 + 41 (16) = 666 | 0030d000 | 0 |
| 141 | 0 | 98 | | | | | |
| 142 | 0 | 68 | | | | | |
| 143 | 0 | 8 | | | | | |
| 144 | 1 | 17 | 0 | 5 | 0 + 42 (16) = 672 | aaaf63cc | a |
| 145 | 1 | 35 | | | | | |
| 146 | 1 | 71 | | | | | |
| 147 | 0 | 14 | 5 | 0 | 5 + 43 (16) = 693 | deffeed0 | 0 |
| 148 | 0 | 28 | | | | | |
| 149 | 1 | 57 | | | | | |
| 150 | 0 | 114 | | | | | |
| 151 | 0 | 100 | 0 | 4 | 0 + 44 (16) = 704 | f2153210 | 5 |
| 152 | 0 | 72 | | | | | |
| 153 | 0 | 16 | | | | | |
| 154 | 0 | 32 | | | | | |
| 155 | 1 | 65 | | | | | |
| 156 | | 2 | | | | | |
| 157 | | 4 | | | | | |

The first 3 columns of Table 9 are associated with the convolutional encoder and only the last portion of the data is listed in the above table. The first part of the data is not necessary to describe the traceback initialization problems. The first column lists the encoder index which generally ranges from 0 to 155. The second column lists the encoder input bit which ranges from 0 to 1. The third column is the encoder state. The encoder state ranges from 0 to $2^{k-1}-1$. This encoder state starts with the 0 state at index 0 and by the f+c bit the encoder is at state 65.

The Viterbi decoder starts with state metric unit 101. State metric unit 101 generates the indexes listed in the third column (enc state) due to no channel errors. These indexes are also called fmaxi. Because of the cascade architecture for k=8, state metric unit 101 will process the ACS units in groups of 4, then 3, then 4, then 3, etc. For this scenario the last active ACS is ACS2 203 and this corresponds to index 155. Index 155 has a fmaxi value of 65. ACS3 208 and ACS4 209 are not active. These units output 0s for the decision bits. Also, the fmaxi is left shifted with two 0s making fmaxi=4. The two left most bits are discarded.

The last 5 columns in Table 9 are associated with traceback unit 103. Traceback unit 103 starts with fmaxi=4 or binary 0000100 for k=8. Bits 6 to 3 [binary 0000] are used to initialize state-hi register 811 and bits 2 to 0 [binary 100] are used to initialize state-lo register 813. This is listed in Table 9 at index 153. Traceback only works with groups of 4 or 3 bits, therefore the traceback data shown in Table 9 is listed only for those grouping of bits. The hard decision RAM 102 address and RAM data index are using the state-hi and state-lo data as listed in Table 3.

The first RAM address for index 153 is 704 from Table 9. This is the correct address. The RAM data is hex f2153210 and the data index is a 4 as shown in the state-lo column. This points to hex 5 and this is incorrect. The hex 5 is loaded into state-hi register 811 and hex 0 is loaded into state-lo register 813. The second RAM address is 693 and the RAM data is hex deffeed0. The data index is a 0 and hex 0 is the selected data. This sequence continues for all remaining data.

The data in the state-hi column should match the binary bits listed in each encoder input bit groupings. In this example the state-hi column matches for index 153, but does not match for 150, 146, and 143. Finally, at 139 it matches again. Therefore, the decoded bits between 140 to 150 are in error. This results in poor BER. This traceback error is due to the incorrect starting index of 4.

Figure 10:
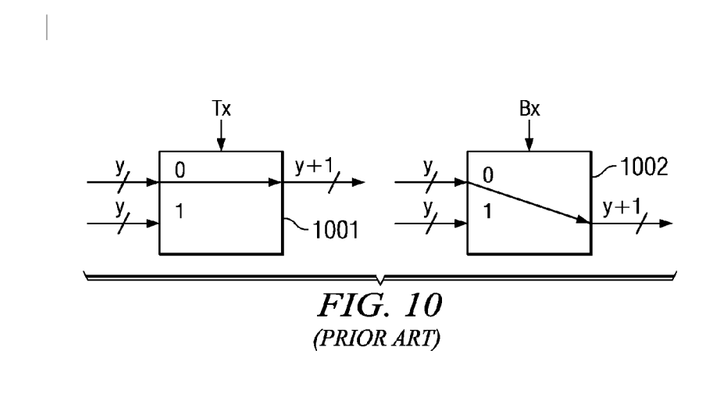
FIG. 10 illustrates the operation of a pretraceback unit illustrated in FIG. 2 when the corresponding add, compare and selection unit is not enabled.

The first part of the solution of this invention is to force the decision bits generated by the unused ACS units to some other value besides zero. One of the problems of outputting zeros for the decision bits for the unused ACS units is that it discards the decision bits on the bottom rail. This is shown in FIG. 10 in which both Tx selection signal to block 1001 and the Bx selection signal to block 1002 are zeros. The bottom rail input is not selected by either block 1001 or 1002.

Figure 11:
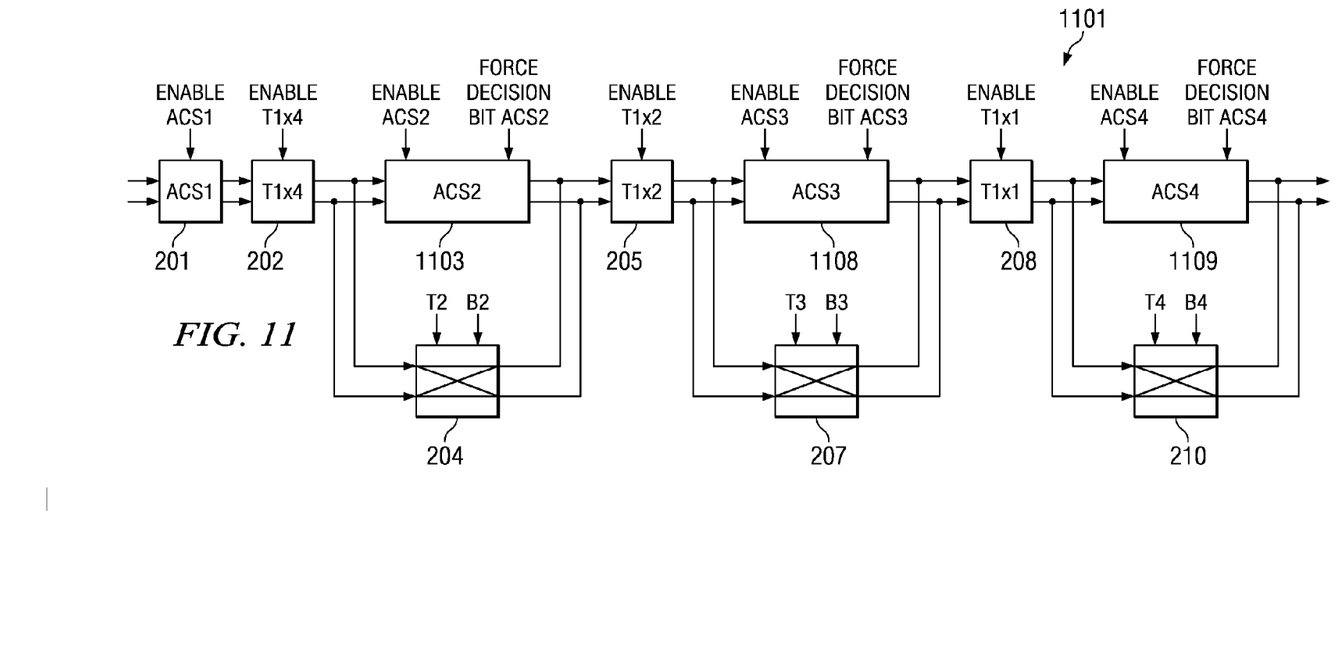
FIG. 11 illustrates the construction of a state metric unit according to this invention.

To solve this problem the unused ACS units decision bits will be both a 0 and a 1. For each unused ACS unit the top rail decision bit Tx will be a 0 and the bottom rail decision bit Rx will be a 1. FIG. 11 illustrates this new construction. FIG. 11 illustrates state metric unit 1101 of this invention. State metric unit 1101 is similar to the prior art state metric unit 101 illustrated in FIG. 2 except for modified ASC2 unit 1103, ASC3 unit 1108 and ASC4 unit 1109. This is controlled by the force decision bit signals as shown in FIG. 11.

Figure 12:
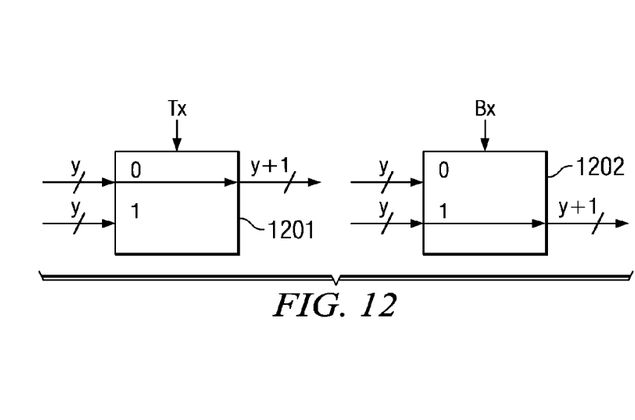
FIG. 12 illustrates the results of the forced decision bit signals on pretraceback units corresponding to the unused add, compare and select units.

FIG. 12 illustrates the results of the forced decision bit signals the unused ACS units. As shown in FIG. 12, Tx block 1201 selects the upper rail 0 input and Bx block 1202 selects the lower rail 1 input. This operation in response to the forced decision bit signal differs from the prior art pass of data for inactivated ACS units.

Figures 13, 14:
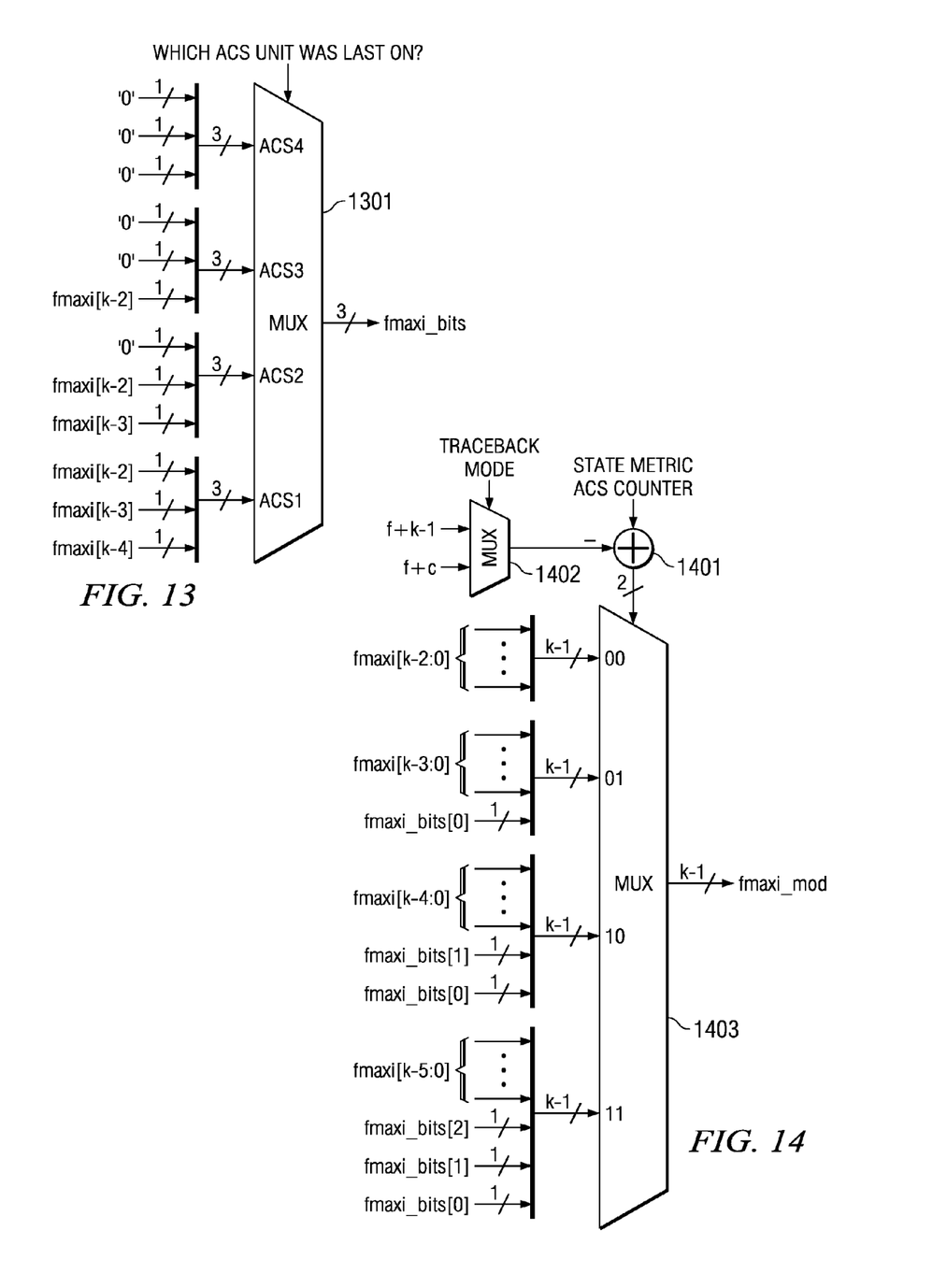
FIG. 13 illustrates the generation of shifted bits called fmaxi_bits.
FIG. 14 illustrates a circuit to calculate a fmaxi_mod signal according to this invention.

The value of fmaxi must be modified by shifting in bits that reflect the path chosen by the pretraceback units for the unused ACS units. FIG. 13 illustrates the generation of these shifted bits called fmaxi_bits. Multiplexer 1301 selects a set of three bits dependent upon a selection signal indicating the last ASC unit that was on. If ACS4 was the last active ACS unit, then no additional bits are necessary. In this event multiplexer 1301 selects the 0s inputs supplied to the ASC4 inputs. If ACS3 was the last active ACS unit, then multiplexer 1301 selects the ACS3 inputs of two 0s and the most significant bit of fmaxi. If ACS2 was the last active ACS unit, then multiplexer 1301 selects the ACS2 inputs which are a 0 and the two most significant bits of fmaxi. If ACS1 was the last active ACS unit, then multiplexer 1301 selects the ACS1 inputs which are the three most significant bits of fmaxi.

FIG. 14 illustrates a circuit to calculate a fmaxi_mod signal according to this invention. This signal is used as the initial value to be loaded into state-hi register 811 and state-lo register 813. Subtracter 1401 subtracts f+k−1 or f+c from the state metric ACS counter signal depending on the traceback mode as selected by multiplexer 1401. The state metric ACS counter signal is the sum of all ACS units during state metric unit 101 operation. The state metric ACS counter signal counts both the active and non-active ACS units that could possibility be active for each pass. The difference between the two numbers formed by subtracter 1410 is either 0, 1, 2 or 3. This is the number of bits that need to be shifted into the fmaxi number to form fmaxi_mod. Depending on the difference calculated by subtracter 1401, multiplexer 1403 selects either k−1 bits of fmaxi unshifted, shifted by 1 bit, shifted by 2 bits or shifted by 3 bits.

For example if the constraint length k is 8 and the convergent length is c, the ACS counter would be 4+3+4+3+ . . . +4+3+4=158 and f+c=135+21=156. The difference computed by subtracter 1410 would equal 158−156=2. Therefore, 2 bits need to be shifted into the fmaxi number. Since fmaxi=65 and k=8, then the 2 bits to be shifted into fmaxi are binary 10. This makes fmaxi go from binary 100001 to binary 000110 or 6.

Figure 15:
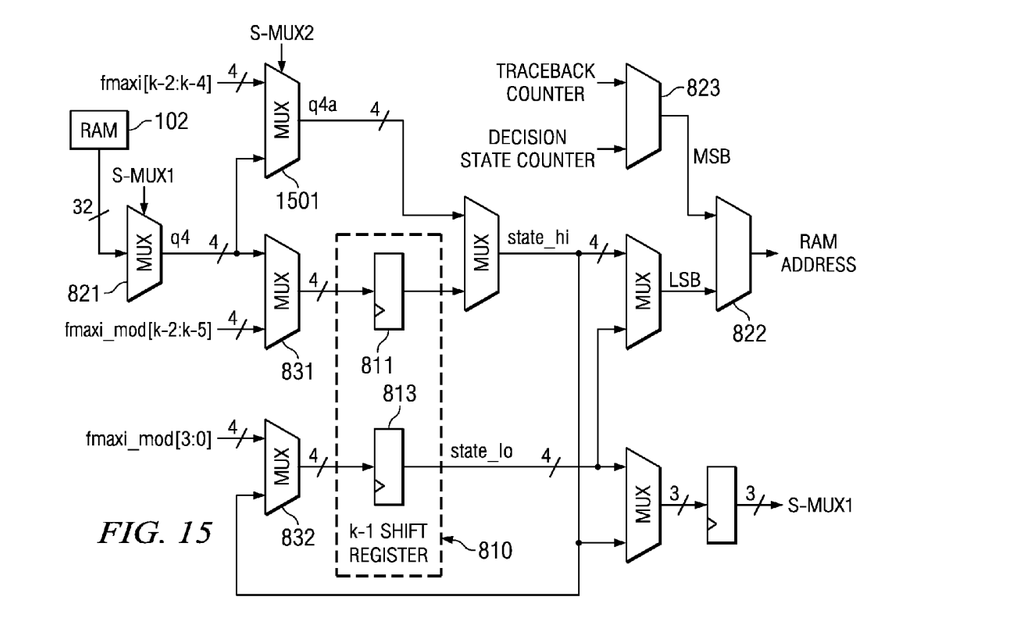
FIG. 15 illustrates a modification of the expanded logic diagram of traceback unit of FIG. 9 according to this invention.

FIG. 15 illustrates a modification of the expanded logic diagram of traceback unit 103 of FIG. 9. The fmaxi inputs have been replaced with fmaxi_mod inputs. An additional multiplexer 1501 controlled by the s_mux2 signal has been added. The fmaxi mod signal is used to initialize state-hi register 811 and state-lo register 813 at the beginning of traceback.

Figure 16:
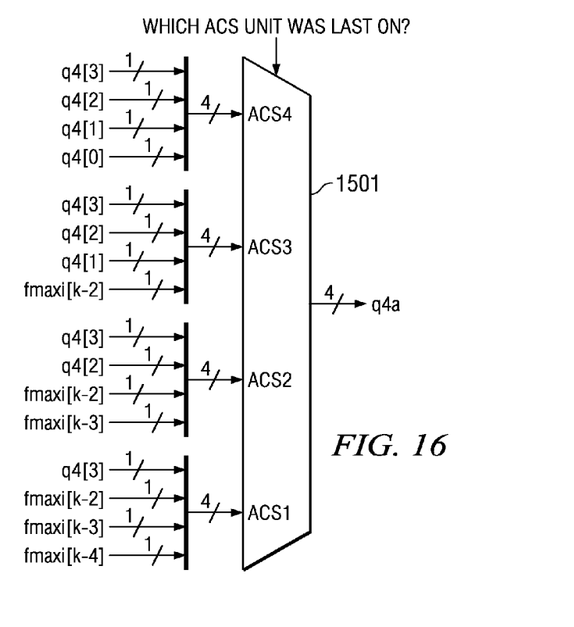
FIG. 16 illustrates a circuit to replaces the shifted fmaxi bits with the most significant bits of the fmaxi signal according to this invention.

Multiplexer 1501 replaces the shifted fmaxi bits due to the unused ACS units with the most significant bits of the fmaxi signal. This logic is shown in FIG. 16. If ACS4 was the last active ACS unit, then multiplexer 1501 selects bits q4[4:0]. If ACS3 was the last active ACS unit, then multiplexer 1501 selects the ACS3 inputs of bits q4[3:1] and the most significant bit of fmaxi. If ACS2 was the last active ACS unit, then multiplexer 1501 selects the ACS2 inputs which are bits q4[3:2] and the two most significant bits of fmaxi. If ACS1 was the last active ACS unit, then multiplexer 1501 selects the ACS1 inputs which are bit q4[3] and the three most significant bits of fmaxi.

Table 10 shows the results of the traceback unit using the modified circuits on FIGS. 11 to 16 on the same example as described in Table 9.

TABLE 10

| enc index | enc input bit | enc state | state_hi | state_lo | RAM Address | RAM Output | dec bits |
|---|---|---|---|---|---|---|---|
| 137 | 0 | 118 | 0 | 8 | 1 + 40 (16) = 641 | bbbbbbbb | b |
| 138 | 0 | 108 | | | | | |
| 139 | 0 | 88 | | | | | |
| 140 | 1 | 49 | 8 | 7 | 8 + 41 (16) = 664 | 00000000 | 0 |
| 141 | 0 | 98 | | | | | |
| 142 | 0 | 68 | | | | | |
| 143 | 0 | 8 | | | | | |
| 144 | 1 | 17 | 15 | 2 | 14 + 42 (16) = 686 | 88188888 | 8 |
| 145 | 1 | 35 | | | | | |
| 146 | 1 | 71 | | | | | |
| 147 | 0 | 14 | 2 | 0 | 2 + 43 (16) = 690 | ffffffff | f |
| 148 | 0 | 28 | | | | | |
| 149 | 1 | 57 | | | | | |
| 150 | 0 | 114 | | | | | |
| 151 | 0 | 100 | 0 | 6 | 0 + 44 (16) = 704 | f2153210 | 2 |
| 152 | 0 | 72 | | | | | |
| 153 | 0 | 16 | | | | | |
| 154 | 0 | 32 | | | | | |
| 155 | 1 | 65 | | | | | |
| 156 | | 2 | | | | | |
| 157 | | 4->6 | | | | | |

The Viterbi decoder starts with state metric unit 101. State metric unit 101 generates the indexes listed in the third column. Because of the cascade architecture for k=8; state metric unit 101 will process the ACS units in groups of 4, then 3, then 4, then 3, etc. In this example the last active ACS is ACS2 1103 corresponding to an index of 155 and a fmaxi value of 65. ACS3 1106 and ACS4 1109 are not active, therefore these units output 0s for the top rail decision bits and is for the bottom rail decision bits. Since fmaxi=65 and ACS2 1103 was the last active bit, the fmaxi_bits are equal to binary 010. Thus fmaxi_mod is equal to 6.

The last 5 columns in the table are associated with traceback unit 103. Traceback unit 103 starts with fmaxi_mod=6 or binary 0000110 for k=8. Bits 6 to 3 binary 0000 initialize state-hi register 811 and bits 2 to 0 binary 110 initialize state-lo register 813. This is shown in the Table 10 at index 153.

The first RAM address is 704 from Table 10 and this is the correct address. The RAM data is hex f2153210 and the data index is a 6 as shown in the state-lo column. This points to hex 2 and this is the correct data. The value hex 2 is loaded into state-hi register 811 and hex 0 is loaded into state-lo register 813. The second RAM address is now 690 and the RAM data is hex ffffffff. The data index is a 0 and hex f is the selected data. This sequence continues for all remaining data. The data in the state-hi column should match the binary bits listed in each encoder input bit groupings. With the modifications of this invention the state-hi data matches at every index and the decoded bits are equal to the encoder input bits. The Viterbi decoder can now achieve optimum performance and get the expected BER. This solution has been verified with approximately 9000 test cases.

Viterbi decoders have two main parts state metric generation and traceback. The BER of the decoder will suffer if the pretraceback and traceback initialization are not correct. If the state metric unit is designed with a cascade architecture, then the unused ACS units must provide decision bits that do not discard valid data and the shifted final maximum state index must take into account the correct shifted bits. This corrected index must be used to initialize the traceback shift register. This data controls both the address generation for the decision RAM and the index of the data read from the RAM. The selected RAM data must have its data modified by removing the unused ACS decision bits with the new final maximum state index. Solving these problems allows the traceback unit to work in an optimum mode and achieve the best bit error rate (BER) possible.

What is claimed is:

1. A Viterbi decoder comprising:
   a state metric unit receiving branch metrics and generating hard decisions, said state metric unit including
      a plurality of selectively operable add, compare and select units coupled in cascade,
      at least one add, compare and select unit having a corresponding pretraceback unit including a first part selecting either a top rail input or a bottom rail input for a top rail output dependent upon a first control signal and a second part selecting either a top rail input of a bottom rail input for a bottom rail output dependent upon a second control signal, each pretraceback unit having a force decision bit input requiring selection of a top rail input for a top rail output and selection of a bottom for a bottom rail output;
   a hard decision memory connected to said state metric unit and storing said hard decisions; and
   a traceback unit connected to said hard decision memory, said traceback unit recalling hard decisions from said hard decision memory and forming decoded bits, said traceback unit including a state index shift register generating part of an address for said hard decision memory and a selection signal for selecting a part of data recalled from said hard decision memory, said traceback unit generating an initial address for said hard decision memory corresponding to a last operable add, compare and select unit.

2. The Viterbi decoder of claim 1, wherein:
   said traceback unit further includes
      a first multiplexer selecting one of a plurality of shifted fmaxi signals dependent upon a last operable add, compare and select unit, and
      a second multiplexer selecting one of a plurality of combinations of fmaxi signals and said output of said first multiplexer dependent upon a traceback mode and an state metric ACS counter, said selected combination supplied to update said state index shift register.

3. The Viterbi decoder of claim 2, wherein:
   said second multiplexer having a control input controlling said selected one of said plurality on combinations of fmaxi signals and said output of said first multiplexer;
   said Viterbi decoder further comprising:
   a third multiplexer having a first input a sum of a frame length, a constraint length minus 1, a second input a sum of said frame length and a convergence length, a control input receiving an indication of traceback mode and an output corresponding to a selected one of said first input or said second input dependent upon said traceback mode indicated by said control signal; and
   a subtracter having a addition input receiving a state metric ACS count and a subtraction input receiving said output of said third multiplexer and a difference output connected to a control input of said second multiplexer for selection of one of a plurality of combinations of fmaxi signals and said output of said first multiplexer dependent upon said difference output.

4. A method of Viterbi decoding comprising the steps of:
   generating hard decisions from cascade of at least one add, compare and selection and transpositions, each add, compare and selection having a corresponding pretraceback selecting either a top rail input or a bottom rail input for a top rail output dependent upon a first control signal and a second part selecting either a top rail input of a bottom rail input for a bottom rail output dependent upon a second control signal, each pretraceback response to a force decision bit input requiring selection of a top rail input for a top rail output and selection of a bottom for a bottom rail output;
   storing said hard decisions; and
   recalling hard decisions from said hard decision memory and forming decoded bits including a state index shift amount generating part of an address for recalling hard decisions and selecting a part of data recalled from said hard decision memory and generating an initial address for recalling hard decisions corresponding to a last operable add, compare and select.

5. The method of Viterbi decoding of claim 4, further comprising the steps of:
   selecting one of a plurality of shifted fmaxi signals dependent upon a last operable add, compare and select unit, and
   selecting one of a plurality of combinations of fmaxi signals and said selected shifted fmaxi signals and an state metric ACS counter, said selected combination supplied to update said state index shift amount.

6. The method of Viterbi decoding of claim 5, wherein:
   said step of selecting one of a plurality of combinations of fmaxi signals and said selected shifted fmaxi signals and an state metric ACS counter by
      selecting one of a sum of a frame length, a constraint length minus 1 and a sum of said frame length and a convergence length, and
      subtracting said selection from a state metric ACS count, and
      selecting of said one of a plurality of combinations of fmaxi signals and said output of said first multiplexer dependent upon said subtraction.

* * * * *

UNITED STATES PATENT AND TRADEMARK OFFICE
CERTIFICATE OF CORRECTION

PATENT NO. : 7,594,162 B2 Page 1 of 1
APPLICATION NO. : 11/382822
DATED : September 22, 2009
INVENTOR(S) : Tod D. Wolf It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 804 days.

Signed and Sealed this

Twenty-eighth Day of September, 2010

David J. Kappos
*Director of the United States Patent and Trademark Office*